(12) United States Patent
Will et al.

(10) Patent No.: US 6,310,764 B1
(45) Date of Patent: Oct. 30, 2001

(54) ELECTROLYTIC CAPACITOR WITH A HIGH OSCILLATION LOAD FACTOR

(75) Inventors: Norbert Will; Rainer Hebel, both of Heidenheim; Rudolf Minihoffer, Koenigsbrunn, all of (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/589,734

(22) Filed: Jun. 9, 2000

(30) Foreign Application Priority Data

Jun. 28, 1999 (DE) ................................ 199 29 598

(51) Int. Cl.[7] .................... H01G 2/02; H01G 9/06; H01G 9/10; H05K 5/06
(52) U.S. Cl. ...................... 361/513; 361/520; 361/518
(58) Field of Search ...................... 361/503, 508–513, 361/515, 516, 512, 518, 519, 520, 306.1–306.3, 307, 308.1–308.3, 328, 329, 522, 541, 266

(56) References Cited

U.S. PATENT DOCUMENTS

| | | | |
|---|---|---|---|
| 3,331,993 | * 7/1967 | Brown et al. | 361/511 |
| 3,475,659 | * 10/1969 | Buice et al. | 361/328 |
| 3,681,666 | * 8/1972 | Bowling | 361/513 |
| 4,288,843 | * 9/1981 | Schroeder | 361/517 |
| 4,546,415 | * 10/1985 | Kent et al. | 361/511 |
| 4,987,518 | * 1/1991 | Dain | 361/517 |
| 4,987,519 | * 1/1991 | Hutins et al. | 361/518 |

FOREIGN PATENT DOCUMENTS

| | | |
|---|---|---|
| 1 925 508 | 11/1969 | (DE) . |
| GM 1826707 | 2/1981 | (DE) . |

* cited by examiner

*Primary Examiner*—Dean A. Reichard
*Assistant Examiner*—Eric W. Thomas
(74) *Attorney, Agent, or Firm*—Schiff Hardin & Waite

(57) ABSTRACT

An electrolytic capacitor in an axial type of construction with a high oscillation load factor has connection strips respectively clamped between the winding and a cup base, or the winding and a disk, and wherein the cup base and a flanged seam of a wall of the cup are respectively welded to respective connecting plates.

11 Claims, 1 Drawing Sheet

ELECTROLYTIC CAPACITOR WITH A HIGH OSCILLATION LOAD FACTOR

BACKGROUND OF THE INVENTION

The present invention concerns an electrolytic capacitor in an axial type of construction with a high oscillation load factor, and having:

a cup containing a winding, a through-contacting lying across from the cup base in the form of a disk which is overlapped by a flanged seam of the cup, a first connection strip from the winding to the cup, and a second connection strip from the through-contacting to the winding.

Electrolytic capacitors having, e.g. an aluminum cup, are increasingly employed on printed circuit boards in the automobile industry. Here the electrolytic capacitors are exposed to intensive mechanical stresses so that they must exhibit a high oscillation load factor. In other words, a reliable and safe attaching of the electrolytic capacitors on the printed circuit boards is of great significance.

Up to now, electrolytic capacitors on printed circuit boards that are exposed to high oscillation loads are preferentially mounted using a solder star. Such a solder star assures a certain oscillation load factor of the electrolytic capacitor. This is, however, not adequate for all requirements. In general, the oscillation resistance of an electrolytic capacitor with solder stars is limited by means of the oscillation resistance of the solder stars on the cup and by means of the strength of the internal weld connections in the electrolytic capacitor. Given prolonged acting oscillations of great amplitude, precisely these internal weld connections can be damaged, which leads to impairments of the electrical properties of the electrolytic capacitor.

An electrolytic capacitor is known from DE GM 182 67 07, whereby a current terminal strip is clamped at its end at the housing of the capacitor. This electrolytic capacitor has the disadvantage that the part of the current terminal strip that is not clamped can be moved by vibrations, whereby this part can be slightly damaged given prolonged acting oscillations.

Other possibilities for the attachment of electrolytic capacitors on a printed circuit board lie in a gluing that is carried out specifically for axial electrolytic capacitors and in an attachment using clamps that are primarily used for radial electrolytic capacitors.

Up to now, however, no one has succeeded in attaching electrolytic capacitors on printed circuit boards in a simple fashion such that the electrolytic capacitors exhibit a high oscillation load factor over long periods of time.

SUMMARY OF THE INVENTION

It is an object of the present invention to provide an electrolytic capacitor in an axial type of construction that can be attached on a printed circuit board in a simple fashion and is distinguished by a high oscillation load factor.

According to the invention, this object is achieved for an electrolytic capacitor of the initially cited type in that the first and second connection strips are respectively clamped between the winding and the cup base or the winding and the disk.

Given the axial electrolytic capacitor of the invention, all components that could deploy their own movement in an oscillation event are fixed; namely, the connection strip from the winding to the cup and from the through-contacting to the winding and the winding itself; the connection strips are clamped by means of the winding and the cup base, or respectively, the disk, so that a self-movement of these connection strips is safely avoided in the oscillation event and thus a mechanical loading of the weld seam and the connection strips is avoided. The winding itself is thus also fixed.

In order to more reliably avoid a self-movement between the winding and the cup, the winding can be additionally fixed by means of a center bead in the cup wall.

An electrolytic capacitor is particularly advantageous, whereby the cup base and flanged seam are respectively welded to a connecting plate.

The stresses that act on the cup base and on the disk, or respectively, the flanged seam, are absorbed by the connecting plates that are attached at the cup base and the flanged seam and can be attached to the printed circuit board by means of solder pins. These stresses are thereby passed on to the printed circuit board via the connecting plates.

The electrolytic capacitor is held by the connecting plates at least at two sides, namely at the cup base and at the disk, so that the weld connections in the electrolytic capacitor are not loaded with leverages.

A disadvantage of the existing electrolytic capacitors with solder stars is overcome by means of the electrolytic capacitor of the invention: given the existing electrolytic capacitors, high leverages act on the welding points between the housing of the electrolytic capacitor and the solder star in the oscillation event. These leverages are considerably reduced for the electrolytic capacitor of the invention by means of its horizontal arrangement on the printed circuit board and by means of the two welded-on connecting plates. The center of gravity of the electrolytic capacitor is also lowered by means of the horizontal arrangement of the electrolytic capacitor on the printed circuit board, and its bearing surface on the printed circuit board is enlarged.

In a particularly preferred exemplary embodiment of the invention, the connecting plates are implemented in their length such that the electrolytic capacitor is arranged at a distance above the printed circuit board so that still more components can be attached between the electrolytic capacitor and the printed circuit board. Moreover, additional space on the printed circuit board is saved as a result thereof.

The invention is described in more detail in the following on the basis of the drawings.

DESCRIPTION OF THE PREFERRED EMBODIMENTS

Figure 1:
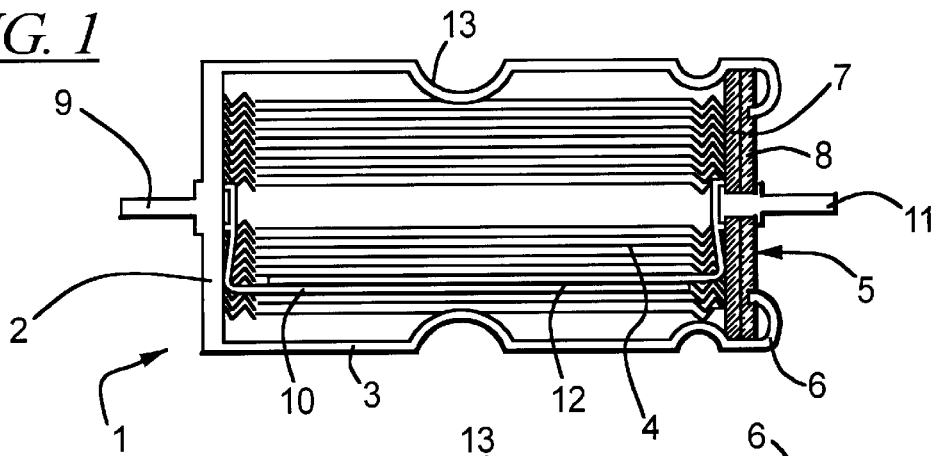
FIG. 1 is a schematic sectional representation of an electrolytic capacitor of the invention in an axial type of construction.

FIG. 1 shows an electrolytic capacitor with a cup 1, with a cup base 2 and a cup wall 3, a winding 4 and a disk 5, which is overlapped by a flanged seam 6 of the cup 1. The cup 1 is composed of, e.g. aluminum, whereas the disk 5 comprises two plates 7 and 8 composed of insulating material.

The cup base 2 is provided with an electrical feed 9, on which the one connecting strip 10 is welded as the connection between the winding 4 and the cup 1. The disk 5 has a through-contacting 11, on which a further connection strip 12 is welded a the connection between the winding 4 and the through-contacting 11.

A center bead 13 is provided in the cup wall 3 which securely fixes the winding 4 in the cup 1.

The connection strips 10, 12 are clamped by means of the winding 4 and the cup base 2, or the disk 5 respectively, so that a self-movement of the connecting strips 10, 12 is reliably prevented in the oscillation event and thereby also a mechanical loading of the weld seam of the connecting strips.

Figure 2:
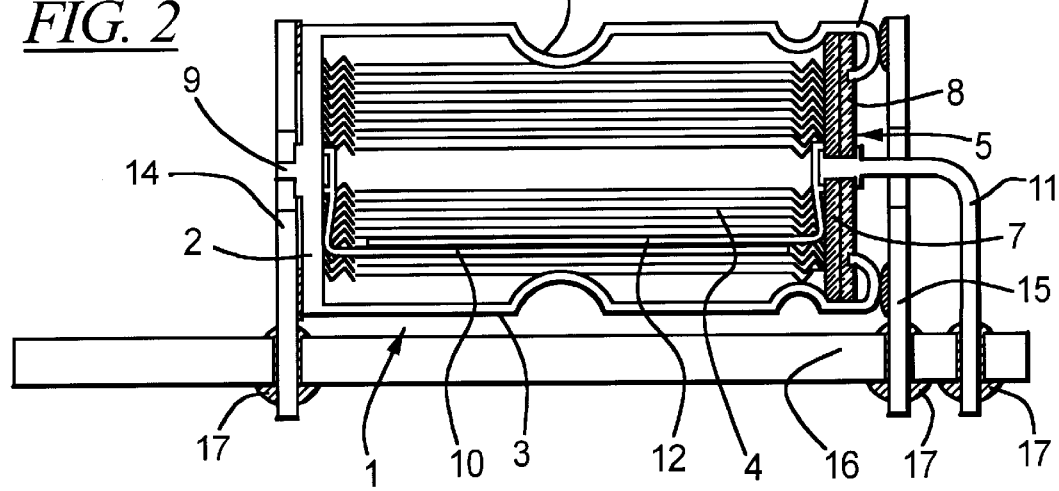
FIG. 2 is a schematic sectional representation of the electrolytic capacitor of the invention on a printed circuit board.

In this structure, the stresses act on the cup base 2 and the disk 5, or the flanged seam 6. These stresses are, as shown in FIG. 2, absorbed by the connecting plates 14, 15, which are welded on to the cup base 2, or the flanged seam 6 respectively and soldered to a printed circuit board 16 via solder pins 17, which also applies to the through-contacting 11. The stresses incident in the electrolytic capacitor given oscillations are thereby transferred onto the printed circuit board 16 via the connecting plates 14, 15. The electrolytic capacitor is thus "doubly" connected to the printed circuit board 16 at points at which the inner stresses are directly incident in the oscillation event.

Figure 3:
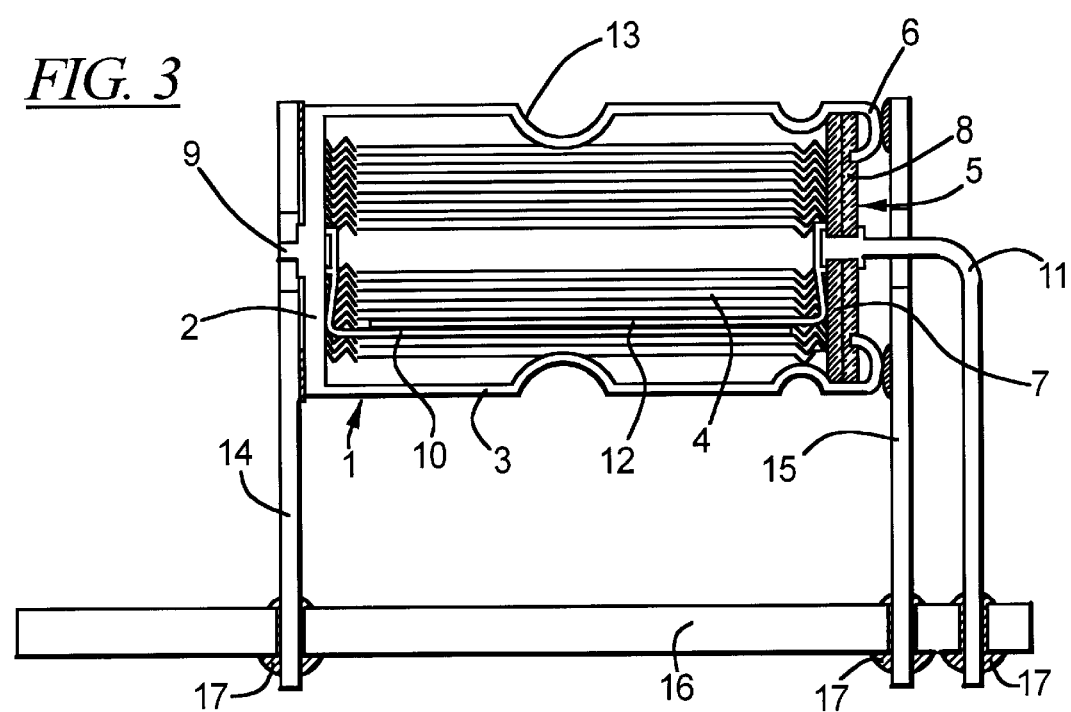
FIG. 3 is a schematic sectional representation of the electrolytic capacitor on a printed circuit board according to a further exemplary embodiment of the invention.

FIG. 3 shows a further exemplary embodiment of the inventive electrolytic capacitor of the invention, whereby the connecting plates 14, 15 are implemented here in such a length that still more components can be attached between the printed circuit board 16 and the electrolytic capacitor.

The clamping of the connection strips 10, 12 to the winding in the cup 1 is essential to the invention. Additionally advantageous is the horizontal positioning of the electrolytic capacitor with the two connecting plates 14, 15 that transfer the internal stresses of the electrolytic capacitor on to the printed circuit board 16.

Although various minor modifications might be suggested by those skilled in the art, it should be understood that our wish to embody within the scope of the patent warranted hereon all such modifications as reasonably and properly come with the scope of our contribution to the art.

We claim as our invention:

1. An electrolytic capacitor in an axial type of construction, comprising:
   a cup containing a winding and having a base;
   a disk lying across from the cup base which is overlapped by a flanged seam of the cup and which comprises a through contacting;
   a first connection strip from the winding to the cup;
   a second connection strip from the through-contacting to the winding; and
   an entire length of the first connection strip protruding from an end of the winding being clamped between the winding and the cup base and an entire length of the second connection strip protruding from an opposite end of the winding being clamped between the winding and the disk.

2. An electrolytic capacitor in an axial type of construction, comprising:
   a cup containing a winding and having a base;
   a disk lying across from the cup base which is overlapped by a flanged seam of the cup and which comprises a through-contacting;
   a first connection strip from the winding to the cup;
   a second connection strip from the through-contacting to the winding;
   the first conduction strip being clamped between the winding and the cup base and the second connection strip being clamped between the winding and the disk; and
   the cup base and flanged seam are each respectively welded to a respective connecting plate.

3. The electrolytic capacitor according to claim 1 wherein the winding is additionally fixed by means of at least one center bead in a wall of the cup.

4. The electrolytic capacitor according to claim 2 wherein the connecting plates are soldered by solder pins at a printed circuit board.

5. The electrolytic capacitor according to claim 4 wherein the connecting plates together with the solder pins have a height such that additional components are attachable to the printed circuit board between the printed circuit board and the electrolytic capacitor.

6. The electrolytic capacitor of claim 2 wherein one of the connecting plates has an aperture through which the through-contacting passes.

7. An electrolytic capacitor in an axial type of construction, comprising:
   a cup containing a winding and having a base;
   a disk lying across from the cup base which is overlapped by a flanged seam of the cup and which comprises a through-contacting;
   a first connection strip from the winding to the cup;
   a second connection strip from the through-contacting to the winding;
   an entire length of the first connection strip protruding from the winding being clamped between the winding and the cup base and an entire length of the second connection strip protruding from the winding being clamped between the winding and the disk;
   the cup base being fixed to a first connecting plate and the flanged seam being fixed to a second connecting plate; and
   the first and second connecting plates being fixed through pins to a printed circuit board along with the through-contacting which is also fixed to the printed circuit board.

8. An electrolytic capacitor in an axial type of construction, comprising:
   a cup containing a winding and having a base;
   a disk lying across from the cup base which is overlapped by a flanged seam of the cup and which comprises a through-contacting;
   a first connection strip from the winding to the cup;
   a second connection strip from the through-contacting to the winding;
   the first connection strip being clamped between the winding and the cup base and the second connection strip being clamped between the winding and the disk;
   the cup base being connected to a first connecting plate and the flanged seam being connected to a second connecting plate;
   the first and second connecting plates being connected through pins to a printed circuit board along with the through-contacting which is also connected to the printed circuit board; and
   the first connecting plate is welded to the cup base and the second connecting plate is welded to the flanged seam.

9. The capacitor according to claim 8 wherein the second connecting plate has an aperture therein through which the through-contacting passes.

10. A method for mounting an electrolytic capacitor having an axial type of construction to a printed circuit board where the capacitor has a cup containing a winding and having a base, a disk lying across from the cup base which is overlapped by a flange seam of the cup and which comprises a through-contacting, and wherein a first connection strip runs from the winding to the cup and a second connection strip runs from the through-contacting to the winding, comprising the steps of:

fixing a first connecting plate to the cup base and fixing a second connecting plate to the flange seam; and soldering pins of the first and second connecting plates to the printed circuit board, and also soldering the through-contacting to the printed circuit board.

11. A method for mounting an electrolytic capacitor having an axial type of construction to a printed circuit board where the capacitor has a cup containing a winding and having a base, a disk lying across from the cup base which is overlapped by a flange seam of the cup and which comprises a through-contacting, and wherein a first connection strip runs from the winding to the cup and a second connection strip runs from the through-contacting to the winding, comprising the steps of:

connecting a first connecting plate to the cup base and connecting a second connecting plate to the flange seam;

soldering pins of the first and second connecting plates to the printed circuit board, and also soldering the through-contacting to the printed circuit board; and welding the first connecting plate to the cup base and welding the second connecting plate to the flange seam.

\* \* \* \* \*